United States Patent
Iwazaki et al.

(10) Patent No.: US 11,107,969 B2
(45) Date of Patent: Aug. 31, 2021

(54) PIEZOELECTRIC DRIVE DEVICE, ROBOT, AND METHOD FOR DRIVING PIEZOELECTRIC DRIVE DEVICE

(71) Applicant: Seiko Epson Corporation, Tokyo (JP)

(72) Inventors: Tomohisa Iwazaki, Matsumoto (JP); Yutaka Arakawa, Hara (JP); Akio Konishi, Matsumoto (JP); Yuichiro Tsuyuki, Matsumoto (JP)

(73) Assignee: Seiko Epson Corporation

( * ) Notice: Subject to any disclaimer, the term of this patent is extended or adjusted under 35 U.S.C. 154(b) by 600 days.

(21) Appl. No.: 15/748,382

(22) PCT Filed: Jul. 6, 2016

(86) PCT No.: PCT/JP2016/003213
§ 371 (c)(1),
(2) Date: Jan. 29, 2018

(87) PCT Pub. No.: WO2017/017907
PCT Pub. Date: Feb. 2, 2017

(65) Prior Publication Data
US 2018/0226561 A1    Aug. 9, 2018

(30) Foreign Application Priority Data

Jul. 30, 2015    (JP) .............................. JP2015-150424

(51) Int. Cl.
*H01L 41/09*     (2006.01)
*H01L 41/047*   (2006.01)
(Continued)

(52) U.S. Cl.
CPC ............ *H01L 41/0533* (2013.01); *B25J 9/12* (2013.01); *B25J 17/02* (2013.01); *H01L 41/047* (2013.01);
(Continued)

(58) Field of Classification Search
CPC ....... H01L 41/09; H01L 41/25; H01L 41/047; H01L 41/053; H01L 41/083;
(Continued)

(56) References Cited

U.S. PATENT DOCUMENTS 5,126,615 A * 6/1992 Takeuchi ............... H01L 41/081
                                                              310/324
5,389,849 A * 2/1995 Asano ........................ B25J 3/04
                                                              310/323.21
(Continued)

FOREIGN PATENT DOCUMENTS

JP    H09-182468 A    7/1997
JP    2003-008094 A   1/2003
(Continued)

*Primary Examiner* — Shawki S Ismail
*Assistant Examiner* — Monica Mata
(74) *Attorney, Agent, or Firm* — Harness, Dickey & Pierce, P.L.C.

(57) ABSTRACT

A piezoelectric drive device includes: a vibrating body having a first surface and a second surface provided with a recessed portion; and a piezoelectric element provided on the first surface. The recessed portion and the piezoelectric element have an overlap region when viewed in a normal direction of the second surface.

12 Claims, 13 Drawing Sheets

(51) Int. Cl.
    *H01L 41/053*     (2006.01)
    *H01L 41/083*     (2006.01)
    *H02N 2/12*     (2006.01)
    *B25J 17/02*     (2006.01)
    *B25J 9/12*     (2006.01)
    *H01L 41/25*     (2013.01)
    *H02N 2/10*     (2006.01)

(52) U.S. Cl.
    CPC .......... *H01L 41/053* (2013.01); *H01L 41/083* (2013.01); *H01L 41/09* (2013.01); *H01L 41/0913* (2013.01); *H01L 41/25* (2013.01); *H02N 2/103* (2013.01); *H02N 2/12* (2013.01)

(58) Field of Classification Search
    CPC ... H01L 41/0533; H01L 41/0913; H02N 2/12; H02N 2/103; B25J 9/12; B25J 17/02
    USPC ........................................................ 310/323
    See application file for complete search history.

(56) References Cited

U.S. PATENT DOCUMENTS

| | | | |
|---|---|---|---|
| 5,821,670 A | | 10/1998 | Tobe et al. |
| 6,104,124 A | * | 8/2000 | Suzuki .................. H02N 2/166 310/323.04 |
| 7,224,102 B2 | | 5/2007 | Miyazawa |
| 10,097,111 B2 | * | 10/2018 | Miyazawa ................ B25J 9/123 |
| 2015/0145926 A1 | * | 5/2015 | Yonemura .......... H01L 41/1878 347/68 |
| 2015/0245972 A1 | * | 9/2015 | Arakawa ............... A61H 1/0288 601/40 |
| 2015/0342818 A1 | * | 12/2015 | Ikebe .................. A61H 1/0288 601/40 |

FOREIGN PATENT DOCUMENTS

| | | |
|---|---|---|
| JP | 2003-134861 A | 5/2003 |
| JP | 2004-187334 A | 7/2004 |
| JP | 2004-320979 A | 11/2004 |
| JP | 2014-082874 A | 5/2014 |

* cited by examiner

PIEZOELECTRIC DRIVE DEVICE, ROBOT, AND METHOD FOR DRIVING PIEZOELECTRIC DRIVE DEVICE

BACKGROUND

Technical Field

The present invention relates to a piezoelectric drive device, a robot, and a method for driving the piezoelectric drive device.

Related Art

A piezoelectric actuator (piezoelectric drive device), which vibrates a piezoelectric body and drives a driven body (driven member), does not need to include a magnet or a coil, and thus the piezoelectric actuator is used in various fields (for example, see JP-A-2004-320979). The piezoelectric drive device has a basic configuration in which four piezoelectric elements are arranged in two rows and two columns on two surfaces of a reinforcing plate. The piezoelectric body performs driving by deforming a vibrating body which is a support member.

However, in JP-A-2004-320979, since the piezoelectric body performs the driving by deforming the vibrating body which is the support member, a problem arises in that efficiency deteriorates due to the stiffness of the vibrating body. In particular, in a case of a thin-film piezoelectric element, the vibrating body has a significant thickness with respect to a film thickness of the piezoelectric element, and thus a profound problem arises.

SUMMARY

The present invention is made to solve at least a part of the problems described above and can be realized as the following aspects or application examples.

Application Example 1

A piezoelectric drive device according to this application example includes: a vibrating body having a first surface and a second surface provided with a recessed portion; and a piezoelectric element provided on the first surface. The recessed portion and the piezoelectric element have an overlap region when viewed in a normal direction of the second surface.

According to this application example, in the piezoelectric drive device using the vibrating body, the recessed portion is formed in the vibrating body, and thus the vibrating body has a low stiffness. In this manner, efficiency improves. In addition, an increase or an optimization of element displacement results in improvement in efficiency to be expected.

Application Example 2

In the piezoelectric drive device according to the application example, it is preferable that the recessed portion has at least one shape of a groove shape or a hole shape.

According to this application example, it is possible to easily form the recessed portion.

Application Example 3

In the piezoelectric drive device according to the application example, it is preferable that the vibrating body has a symmetrical shape to a first line, and the recessed portions are arranged to be symmetric to the first line.

According to this application example, the vibrating body has an isotropic stiffness due to the arrangement of the recessed portions, and thus it is possible to perform control such that a distribution of tracks drawn by a distal end of the piezoelectric drive device does not depend on a direction.

Application Example 4

In the piezoelectric drive device according to the application example, it is preferable that the vibrating body has a symmetrical shape to a first line, and the recessed portions are arranged to be nonsymmetric to the first line.

According to this application example, the vibrating body has an anisotropic stiffness due to the arrangement of the recessed portions, and thus it is possible to control tracks drawn by the distal end of the piezoelectric drive device.

Application Example 5

In the piezoelectric drive device according to the application example, it is preferable that the first surface is flat.

According to this application example, it is possible to easily form a thin film of the piezoelectric element by using a film forming process.

Application Example 6

In the piezoelectric drive device according to the application example, it is preferable that the piezoelectric element includes a first electrode, a second electrode, and a piezoelectric body that is positioned between the first electrode and the second electrode. A thickness of the piezoelectric body is within a range of 50 nm to 20 μm.

According to this application example, when the thickness of the piezoelectric body is 0.05 μm or larger, it is possible to generate a sufficiently larger force depending on expansion/contraction of the piezoelectric body. In addition, when the thickness of the piezoelectric body is 20 μm or smaller, it is possible to sufficiently decrease a piezoelectric vibration unit in size.

Application Example 7

In the piezoelectric drive device according to the application example, it is preferable that the vibrating body contains silicon.

According to this application example, since it is possible to manufacture the piezoelectric drive device by applying a semiconductor manufacturing device or a semiconductor manufacturing process thereto, it is possible to manufacture a small piezoelectric drive device with high accuracy.

Application Example 8

It is preferable that the piezoelectric drive device according to the application example further includes a first piezoelectric vibration unit and a second piezoelectric vibration unit which have the vibrating body and the piezoelectric element.

According to this application example, since the two piezoelectric vibration units of the first piezoelectric vibration unit and the second piezoelectric vibration unit are provided, it is possible to obtain high power.

Application Example 9

In the piezoelectric drive device according to the application example, it is preferable that the second piezoelectric vibration unit is stacked on the first piezoelectric vibration unit.

According to this application example, the second piezoelectric vibration unit is stacked on the first piezoelectric vibration unit, and thereby it is possible to obtain high power. In addition, in a case where elements are stacked in multiple layers, the recessed portions of the surface of the vibrating body play a role of a shelter of adhesive, and thus it is possible to prevent the adhesive from oozing out.

Application Example 10

A robot according to this application example includes a plurality of link units; joint portions that connect the plurality of link units, and the piezoelectric drive device according to any one of the application examples that rotates the plurality of link units with respect to the joint portions.

According to this application example, it is possible to use the piezoelectric drive device for driving the robot.

Application Example 11

In a method for driving the piezoelectric drive device according to this application example as a method for driving the piezoelectric drive device according to any one of the application examples, the piezoelectric drive device includes a first electrode, a second electrode, and a piezoelectric body that is positioned between the first electrode and the second electrode in the piezoelectric drive device. The method includes: applying periodically changing voltage between the first electrode and the second electrode.

According to this application example, since voltage is applied to the piezoelectric body of the piezoelectric element in only one direction, it is possible to improve durability of the piezoelectric body.

The present invention can be realized in various types of aspects and, for example, can be realized in various embodiments such as a method for driving the piezoelectric drive device, a method for manufacturing the piezoelectric drive device, a robot in which the piezoelectric drive device is installed, a method for driving the robot in which the piezoelectric drive device is installed, an electronic component conveying device, a liquid feeding pump, a medicine injecting pump, and the like, as well as the piezoelectric drive device.

BRIEF DESCRIPTION OF DRAWINGS

FIG. 1A is a plan view, and FIG. 1B is a sectional view taken along line 1B-1B.

FIGS. 10A and 10B are views in which four piezoelectric vibration units are provided, and FIG. 10C is a view in which two piezoelectric vibration units are provided.

FIG. 11A is a view in which three piezoelectric elements are formed, FIG. 11B is a view in which four piezoelectric elements are formed, and FIG. 11C is a view in which one second electrode is formed.

DETAILED DESCRIPTION

Hereinafter, embodiments of the present invention will be described with reference to the figures. The figures used are shown by being appropriately enlarged or reduced in size such that parts to be described are shown in a recognizable state.

Figure 1A:
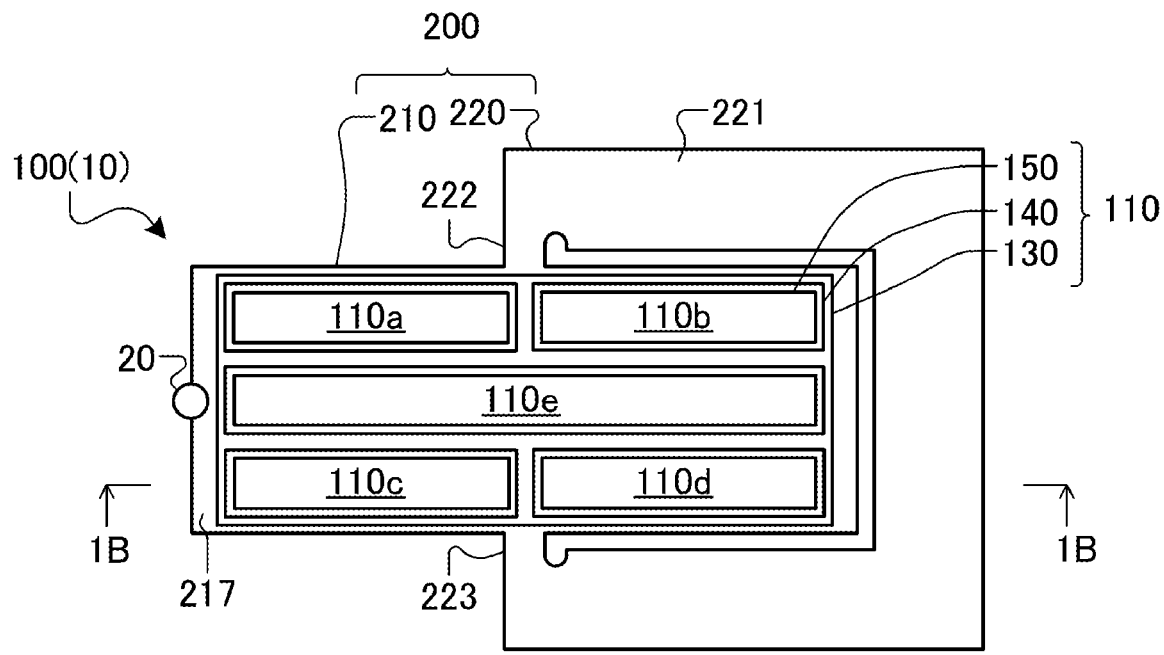
FIGS. 1A and 1B are views illustrating a schematic configuration of a piezoelectric vibration unit according to the present embodiment.
Figure 1B:
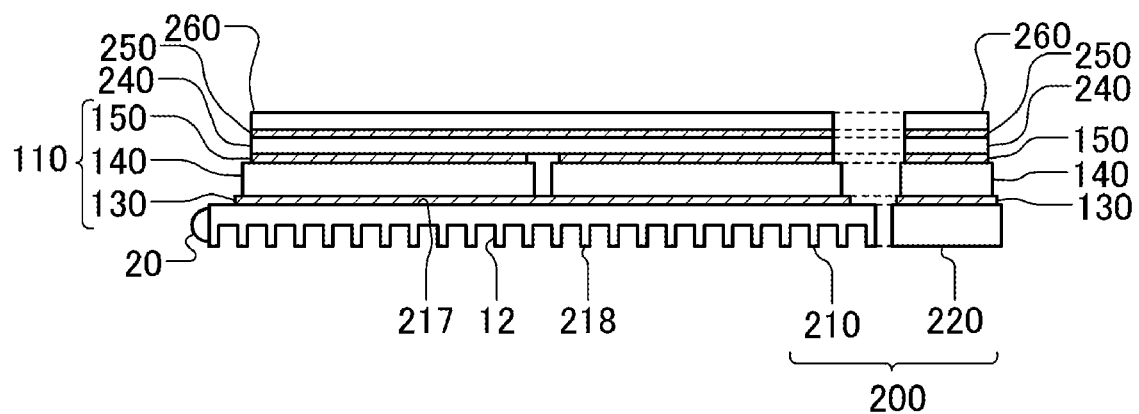

FIG. 1 illustrates views illustrating a schematic configuration of a piezoelectric vibration unit according to the present embodiment. FIG. 1(A) is a plan view, and FIG. 1(B) is a sectional view taken along line 1B-1B. In the plan view in FIG. 1(A), an insulating film 240, a wiring electrode 250, and a protective film 260 in FIG. 1(B) are omitted. First, a relationship between a piezoelectric drive device 10 and a piezoelectric vibration unit 100 is described. The piezoelectric drive device 10 includes one or more piezoelectric vibration units 100. Hence, in a case where only one piezoelectric vibration unit 100 is provided, the piezoelectric drive device 10 and the piezoelectric vibration unit 100 are the same as each other.

The piezoelectric vibration unit 100 includes a substrate 200, a piezoelectric element 110, the insulating film 240, the wiring electrode 250, and the protective film 260. The substrate 200 includes a vibrating body 210 and a support 220. The vibrating body 210 and the support 220 are connected at the center of a long side of the vibrating body 210. End portions of the support 220 which are connected to the vibrating body 210 are referred to as a "first connecting portion 222", and a "second connecting portion 223", and a region except for the first connecting portion 222 and the second connecting portion 223 is referred to as a fixed portion 221. In a case where the first connecting portion 222 is not distinguished from the second connecting portion 223, the "first connecting portion 222" and the "second connecting portion 223" are referred to as the "connecting portion 222" and the "connecting portion 223", respectively. The vibrating body 210 has a first surface 217 and a second surface 218 provided with recessed portions 12. The piezoelectric element 110 is formed on the substrate 200. The piezoelectric element 110 is formed on the first surface 217 of the substrate 200. The recessed portion 12 and the piezoelectric element 110 have an overlap region when viewed in a normal direction of the second surface 218. The insulating film 240, the wiring electrode 250, and the protective film 260 are formed on the piezoelectric element 110. The first surface 217 of the substrate 200 may be flat. According to this, it is possible to easily form a thin film of the piezoelectric element 110 by using a film forming process.

The piezoelectric element 110 includes a first electrode 130 (also referred to as a "first electrode film 130" because the electrode is formed into a film shape), a piezoelectric body 140 (also referred to as a "first piezoelectric body film 140" because the piezoelectric body is formed into a film shape) formed on the first electrode 130, and a second electrode 150 (also referred to as a "second electrode film 150" because the piezoelectric body is formed into a film shape) formed on the piezoelectric body 140. The piezoelectric body 140 is interposed between the first electrode 130 and the second electrode 150. For example, the first electrode 130 or the second electrode 150 is a thin film that is formed through sputtering. Examples of materials of the first electrode 130 or the second electrode 150 can include any material having high conductivity, such as aluminum (Al), nickel (Ni), gold (Au), platinum (Pt), iridium (Ir), or copper (Cu).

For example, the piezoelectric body 140 is formed through a sol-gel method or a sputtering method and has a thin film shape. Examples of materials of the piezoelectric body 140 can include any material exhibiting a piezoelectric effect, such as ceramics having an $ABO_3$-type perovskite structure. Examples of the ceramics having the $ABO_3$-type perovskite structure can include lead zirconate titanate (PZT), barium titanate, lead titanate, potassium niobate, lithium niobate, lithium tantalate, sodium tungstate, zinc oxide, barium strontium titanate (BST), strontium bismuth tantalate (SBT), lead metaniobate, lead zinc niobate, scandium lead niobate, and the like. Otherwise, examples of materials having the piezoelectric effect other than the ceramics can include polyvinylidene fluoride, a quartz crystal, and the like. It is preferable that the piezoelectric body 140 has a thickness in a range of 50 nm (0.05 μm) to 20 μm. It is possible to easily form the thin film of the piezoelectric body 140 having a thickness in this range by using a film forming process. According to this, when the thickness of the piezoelectric body 140 is 0.05 μm or larger, it is possible to generate a sufficiently large force depending on expansion/contraction of the piezoelectric body 140. In addition, when the thickness of the piezoelectric body 140 is 20 μm or smaller, it is possible to sufficiently decrease the piezoelectric vibration unit 100 in size.

In the present embodiment, the piezoelectric vibration unit 100 includes five piezoelectric elements 110a, 110b, 110c, 110d, and 110e as the piezoelectric element 110. The piezoelectric element 110e is formed to have a substantially rectangular shape and is formed to parallel to the longitudinal direction of the vibrating body 210 at the center of the vibrating body 210 in the width direction thereof. The piezoelectric elements 110a, 110b, 110c, and 110d are formed at four corner positions of the vibrating body 210. FIG. 1 illustrates an example in which the piezoelectric elements 110 are formed on one surface of the vibrating body 210; however, the piezoelectric elements 110 may be formed on two surfaces of the vibrating body 210. In this case, it is preferable that the piezoelectric elements 110a to 110e on the one surface and the piezoelectric elements 110a to 110e on the other surface are arranged at symmetry sites with the vibrating body 210 as a symmetry plane.

The substrate 200 is used as a substrate on which the first electrode 130, the piezoelectric body 140, and the second electrode 150 are formed through the film forming process. In addition, the vibrating body 210 of the substrate 200 functions as a vibrating plate that performs mechanical vibration. For example, the substrate 200 can be formed of Si, $Al_2O_3$, $ZrO_2$, or the like. An Example of the Si substrate 200 (also referred to as a "silicon substrate 200") can include a Si wafer for manufacturing a semiconductor. According to this, since it is possible to manufacture the piezoelectric drive device 10 by applying a semiconductor manufacturing device or a semiconductor manufacturing process thereto, it is possible to manufacture a small piezoelectric drive device 10 with high accuracy. It is preferable that the substrate 200 has a thickness in a range of 10 μm to 100 μm. When the thickness of the substrate 200 is 10 μm or larger, it is possible to relatively easily handle the substrate 200 during a film forming process on the substrate 200. When the thickness of the substrate 200 is 50 μm or larger, it is possible to more easily handle the substrate 200. In addition, when the thickness of the substrate 200 (the vibrating body 210) is 100 μm or smaller, it is possible to easily vibrate the vibrating body 210 depending on expansion/contraction of the piezoelectric body 140 formed as a thin film.

In the present embodiment, the first electrode 130, the piezoelectric body 140, the second electrode 150, the insulating film 240, the wiring electrode 250, and the protective film 260 are formed also on the support 220. As a result, the piezoelectric vibration unit 100 having the vibrating body 210 and the piezoelectric vibration unit 100 having the support 220 can have substantially the same thickness (for example, a difference in thickness is 6 μm or smaller, or 3 μm or smaller). In a case where the piezoelectric drive device 10 has a configuration in which a plurality of piezoelectric vibration units 100 overlap each other in this manner, a gap between two adjacent piezoelectric vibration unit 100 on the vibrating body 210 can be substantially the same as a gap between two adjacent piezoelectric vibration unit 100 on the support 220. Therefore, rattling between the piezoelectric vibration units 100 is unlikely to occur. It is preferable that the first electrode 130, the piezoelectric body 140, and the second electrode 150 on the fixed portion 221 do not configure an operable piezoelectric element. When the operable piezoelectric element is not configured, the piezoelectric body 140 is not deformed. Therefore, the fixed portion 221 is easily fixed to another member. In the present embodiment, as will be described below, voltage is applied to the first electrode 130 and the second electrode 150 on the vibrating body 210 via the wiring electrode 250. In order not to configure the operable piezoelectric element, at least one of the following methods is performed. (i) The first electrode 130 and the second electrode 150 on the fixed portion 221 are not connected to the wiring electrode 250 for applying the voltage to the first electrode 130 and the second electrode 150 on the vibrating body 210, or (ii) the first electrode 130 on the fixed portion 221 is connected to the second electrode 150 on the fixed portion 221. The electrodes 130 and 150 on the fixed portion 221 and the electrodes 130 and 150 on the vibrating body 210 are not connected to each other but are separated from each other. In the above description, the first electrode 130, the piezoelectric body 140, and the second electrode 150 are formed on the support 220 (the fixed portion 221 and the connecting portions 222 and 223); however, a configuration in which the first electrode 130, the piezoelectric body 140, and the second electrode 150 are not formed on the connecting portions 222 and 223 to the support 220 may be employed.

Figure 2:
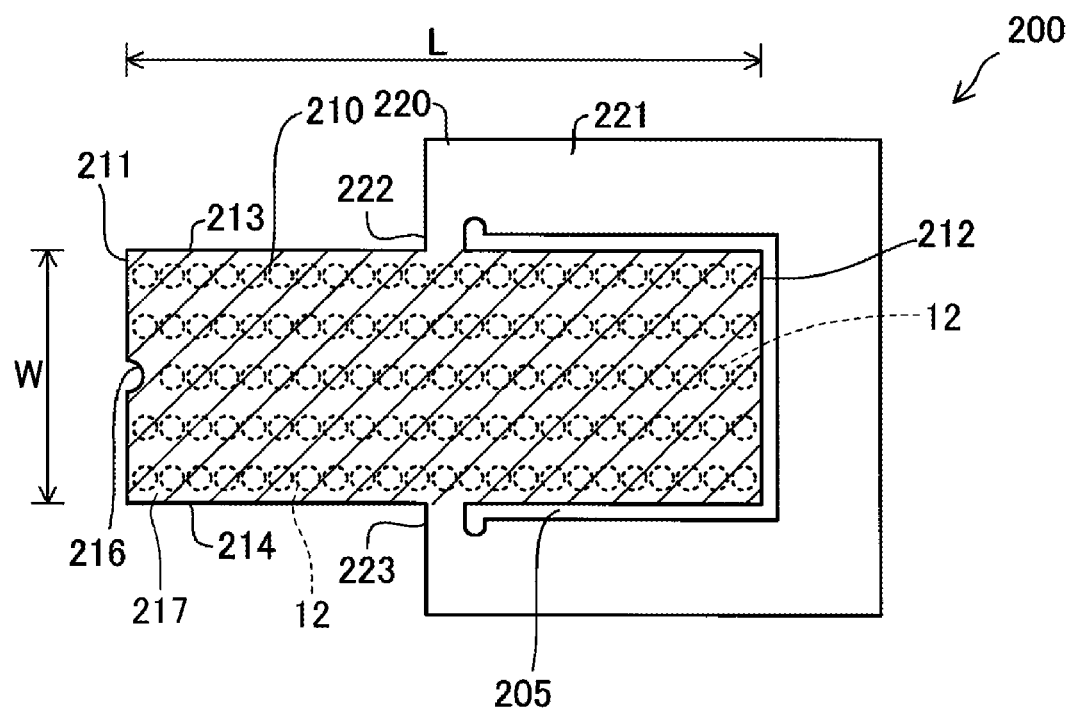
FIG. 2 is a plan view illustrating a substrate according to the present embodiment.

FIG. 2 is a plan view illustrating the substrate 200 according to the present embodiment. The substrate 200 includes the vibrating body 210 and the support 220 (the fixed portion 221 and the connecting portions 222 and 223). In FIG. 2, in order to easily distinguish between the vibrating body 210 and the support 220, the vibrating body 210 is hatched, and the support 220 (the fixed portion 221 and the connecting portions 222 and 223) is not hatched. The vibrating body 210 has a rectangular shape with four sides of a first side 211, a second side 212, a third side 213, and a fourth side 214. The first side 211 and the second side 212 are opposite sides to each other, and the third side 213 and the fourth side 214 are opposite sides to each other. The third side 213 and the fourth side 214 are continuous between the first side 211 and the second side 212 and are longer than the first side 211.

The vibrating body 210 has the first surface 217 and the second surface 218 provided with a recessed portion 12. The vibrating body 210 is provided with at least one recessed portion 12. The recessed portion 12 has a hole shape. The recessed portion 12 may have a groove shape. According to this, it is possible to easily form the recessed portion 12.

There is no particular limitation to the shape of the recessed portion 12, and the recessed portion may have a circularly columnar shape. The inner circumference of the recessed portion 12 may be tapered. The planar shape of the recessed portion 12 may be a rectangle or a circle. The recessed portions 12 may be arranged in a zigzag pattern.

The vibrating body 210 has a symmetrical shape to a first line. Here, the first line is an arbitrary line. In the present embodiment, the first line means a line that connects the center of the first side 211 and the center of the second side 212 and means a line that connects the center of the third side 213 and the center of the fourth side 214.

The recessed portions 12 may be arranged to be symmetrical with respect to the first line. According to this, the vibrating body 210 has an isotropic stiffness due to the arrangement of the recessed portions 12, and thus it is possible to perform control such that a distribution of tracks drawn by a distal end of the piezoelectric drive device 10 does not depend on a direction.

The recessed portions 12 may be arranged to be asymmetrical with respect to the first line. According to this, the vibrating body 210 has an anisotropic stiffness due to the arrangement of the recessed portions 12, and thus it is possible to control tracks drawn by the distal end of the piezoelectric drive device 10.

The two connecting portions 222 and 223 are provided at end portions of the fixed portion 221 and are connected to respective central positions of the third side 213 and the fourth side 214 of the vibrating body 210. The fixed portion 221 is disposed on a side closer to the second side 212 than to the first side 211 so as to reach the second connecting portion 223 from the first connecting portion 222 toward the side of the second side 212. The vibrating body 210 and the support 220 are integrally formed from one silicon substrate. Specifically, the silicon substrate, on which the piezoelectric element 110 is formed, is etched, thereby the shape of each individual substrate 200 is formed, and a gap 205 is formed between the vibrating body 210 and the support 220. In this manner, the vibrating body 210 and the support 220 (the fixed portion 221 and the connecting portions 222 and 223) are integrally formed.

It is preferable that a ratio of a length L of the vibrating body 210 (a length of the third side 213 or the fourth side 214) and a width W thereof (a length of the first side 211 or the second side 212), that is, L to W, is about 7 to 2. This ratio is a value that is preferably used to perform ultrasonic vibration (to be described below) in which the vibrating body 210 bends right and left along a plane thereof. For example, the length L of the vibrating body 210 can be in a range of 0.1 mm to 30 mm, and the width W thereof can be in a range of 0.02 mm to 9 mm. In order for the vibrating body 210 to perform the ultrasonic vibration, the length L is preferably 50 mm or shorter.

Figure 3:
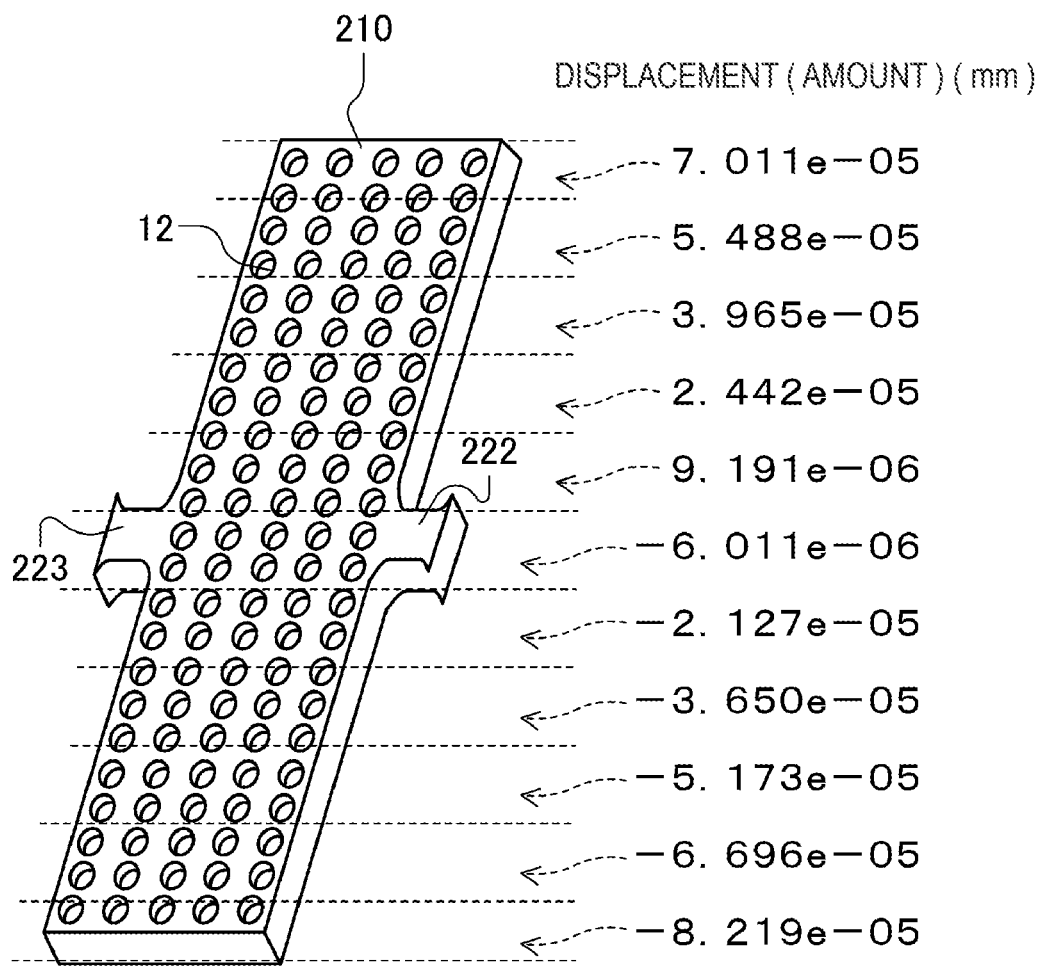
FIG. 3 is a diagram illustrating the stiffness of a vibrating body according to the present embodiment.
Figure 4:
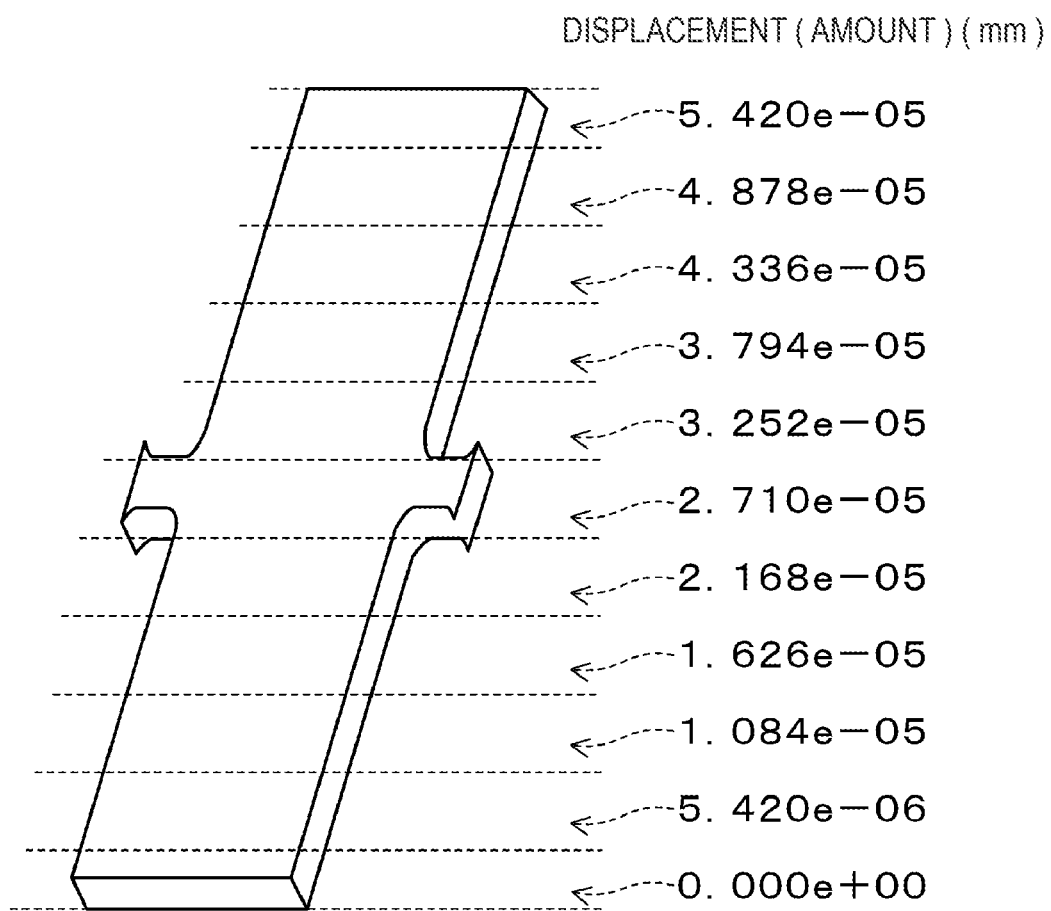
FIG. 4 is a diagram illustrating the stiffness of a vibrating body in the related art.

FIG. 3 is a diagram illustrating the stiffness of the vibrating body 210 according to the present embodiment. FIG. 4 is a diagram illustrating the stiffness of a vibrating body in the related art.

In order to confirm the effect of the embodiment described above, simulation of the stiffness of the vibrating body 210 is performed. The vibrating body 210 has a vertical side of 3.5 mm, a horizontal side of 1.00 mm, and a thickness of 0.2 mm (two sheets by 0.1 mm per sheet) in size. The connecting portions 222 and 223 have a vertical side of 0.25 mm and a horizontal side of 0.3 mm in size. The recessed portion 12 has Φ of 0.1 mm and a depth of 0.05 mm. The arrangement thereof is performed in a vertical pitch of 0.15 mm and a horizontal pitch of 0.2 mm and 115 holes of 23 by 5 are arranged on one side (the recessed portions 12 are present on both surfaces).

Results of the simulation are shown in FIGS. 3 and 4. A displacement (amount) for each region is obtained when the same force is applied in an element longitudinal direction, and a large displacement means that the vibrating body 210 has a lower stiffness. The vibrating body 210 has a shape in which the recessed portions 12 are formed in a pattern as illustrated in FIG. 3, and thereby the displacement (displacement obtained when tension of 1 N is applied) is 54 nm (without recessed portions) and is 70 nm (with the recessed portions 12). As a result, the displacement increases to about 1.3 times compared to the shape without the recessed portion in FIG. 4. In other words, in a case where the same electric power is applied to the piezoelectric elements 110, the displacement increases to about 1.3 times. It is possible to expect that an output will increase by an amount of an increase in the displacement. When the output increases with the same electric power, the efficiency improves.

The vibrating body 210 has the first side 211 provided with a recessed portion 216. A contact 20 that can come into contact with a driven member is fitted into and bonded (normally, adheres) to the recessed portion 216. The contact 20 is a member for coming into contact with the driven member and applying a force to the driven member. It is preferable that the contact 20 is formed of a material such as ceramics (for example, $Al_2O_3$) having durability.

Figure 5:
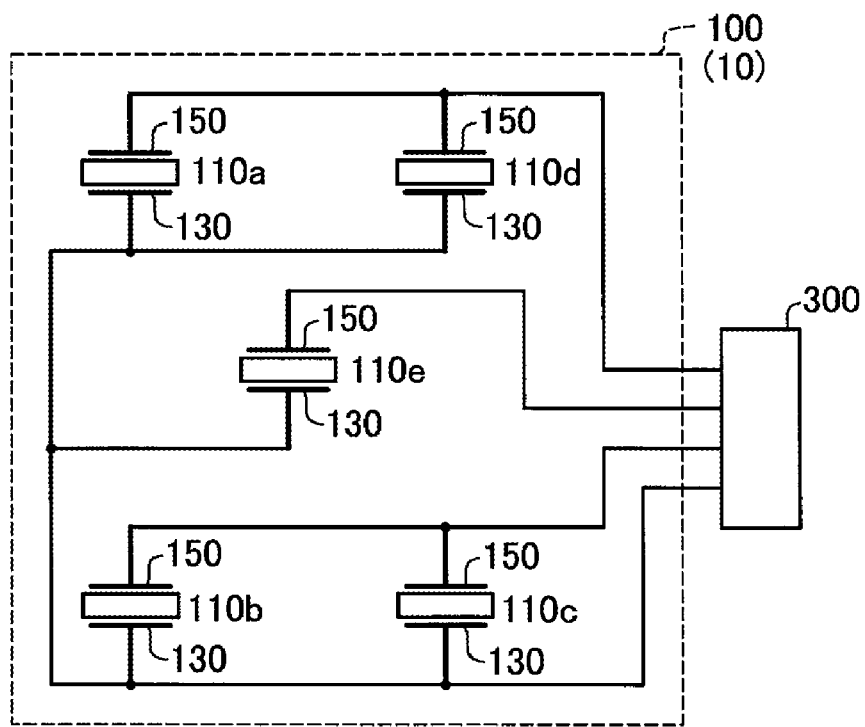
FIG. 5 is a diagram illustrating an equivalent circuit of a piezoelectric drive device.

FIG. 5 is a diagram illustrating an equivalent circuit of the piezoelectric drive device 10. The equivalent circuit illustrated in FIG. 5 is an example in which one piezoelectric vibration unit 100 operates. The piezoelectric elements 110 are divided into three groups. A first group includes two piezoelectric elements 110a and 110d. A second group includes two piezoelectric elements 110b and 110c. A third group includes only one piezoelectric element 110e. The piezoelectric elements 110a and 110d in the first group are connected to each other in parallel and are connected to a drive circuit 300. The piezoelectric elements 110b and 110c in the second group are connected to each other in parallel and are connected to the drive circuit 300. The piezoelectric element 110e in the third group is solely connected to the drive circuit 300.

The drive circuit 300 applies AC voltage or pulsating voltage, which periodically changes, to a predetermined piezoelectric element of the five piezoelectric elements 110a to 110e, for example, between the first electrode 130 and the second electrode 150 of the piezoelectric elements 110a and 110d in the first group. In this manner, it is possible to cause the piezoelectric vibration unit 100 to perform the ultrasonic vibration, and to rotate a rotor (a driven body or a driven member), which comes into contact with the contact 20, in a predetermined rotating direction. Here, the "pulsating voltage" means voltage obtained by adding a DC offset to the AC voltage, and an orientation of the voltage (electric field) of the pulsating voltage is one direction from one electrode to the other electrode. The orientation of a current is more preferably from the second electrode 150 to the first electrode 130 than from the first electrode 130 to the second electrode 150. In addition, the AC voltage or the pulsating voltage is applied between the first electrode 130 and the second electrode 150 of the piezoelectric elements 110b and 110c in the second group, and thereby it is possible to rotate the rotor, which comes into contact with the contact 20, in a reverse direction.

The drive circuit 300 may apply the AC voltage or the pulsating voltage having the same frequency as a resonance frequency of the piezoelectric element 110. In this manner, it is possible to cause the piezoelectric element 110 to smoothly perform bending vibration or longitudinal vibration. The piezoelectric drive device 10 of the present embodiment includes the vibrating body 210 having the recessed portions 12, and thereby the resonance frequency of the piezoelectric element 110 decreases. In addition, a difference between the longitudinal resonance and the bending resonance changes, and thus it is possible to adjust the resonance frequency with the number or shape of the recessed portions 12. Further, the vibrating body 210 can have an anisotropic stiffness depending on a distribution of shapes or the shape of the recessed portions 12. In this manner, it is possible to control a displacement of tracks drawn by the contact 20 that is brought into contact with the rotor, and it is possible to realize more efficient driving.

Figure 6:
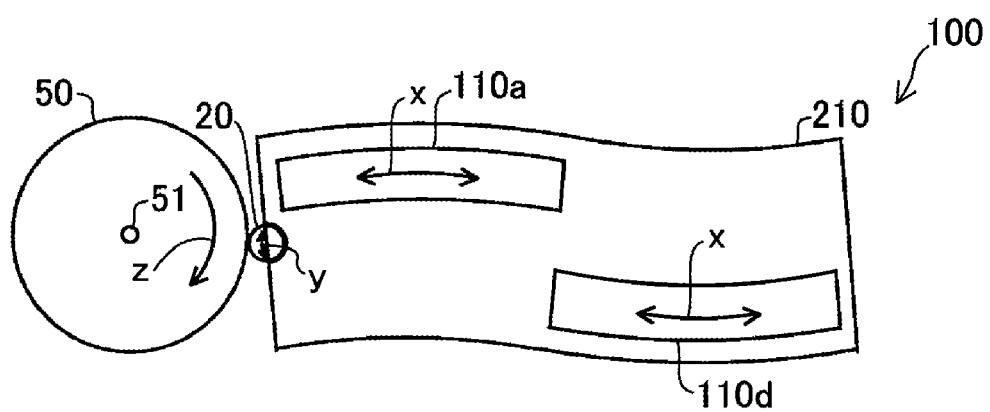
FIG. 6 is a diagram illustrating an example of an operation of the piezoelectric vibration unit.

FIG. 6 is a diagram illustrating an example of an operation of the piezoelectric vibration unit 100. The contact 20 of the piezoelectric vibration unit 100 comes into contact with an outer circumference of a rotor 50 as the driven member. In the example illustrated in FIG. 6, the AC voltage or the pulsating voltage is applied to the two piezoelectric elements 110a and 110d in the first group, and the piezoelectric elements 110a and 110d expand or contract in a direction of an arrow x in FIG. 6. In this respect, the vibrating body 210 of the piezoelectric vibration unit 100 is bent within the plane of the vibrating body 210 and is deformed into a meandering shape (S shape), and thus a distal end of the contact 20 reciprocates in an orientation of arrow y or moves elliptically. As a result, the rotor 50 rotates in a predetermined direction z (clockwise direction in FIG. 6) around the center 51 of the rotor. In a case where the drive circuit 300 applies the AC voltage or the pulsating voltage to the two piezoelectric elements 110b and 110c (FIG. 1) in the second group 2, the rotor 50 rotates in the reverse direction. When the AC voltage or the pulsating voltage is applied to the central piezoelectric element 110e, the piezoelectric drive device 10 expands and contracts in the longitudinal direction, and thus it is possible to more increase a force applied to the rotor 50 from the contact 20. According to this, since the voltage is applied to the piezoelectric bodies 140 of the piezoelectric elements 110a and 110d in only one direction, it is possible to improve durability of the piezoelectric bodies 140. Such an operation of the piezoelectric drive device 10 (or the piezoelectric vibration unit 100) is described in JP-A-2004-320979 or corresponding U.S. Pat. No. 7,224,102, and the content of the disclosure is incorporated herein by reference.

Figure 7:
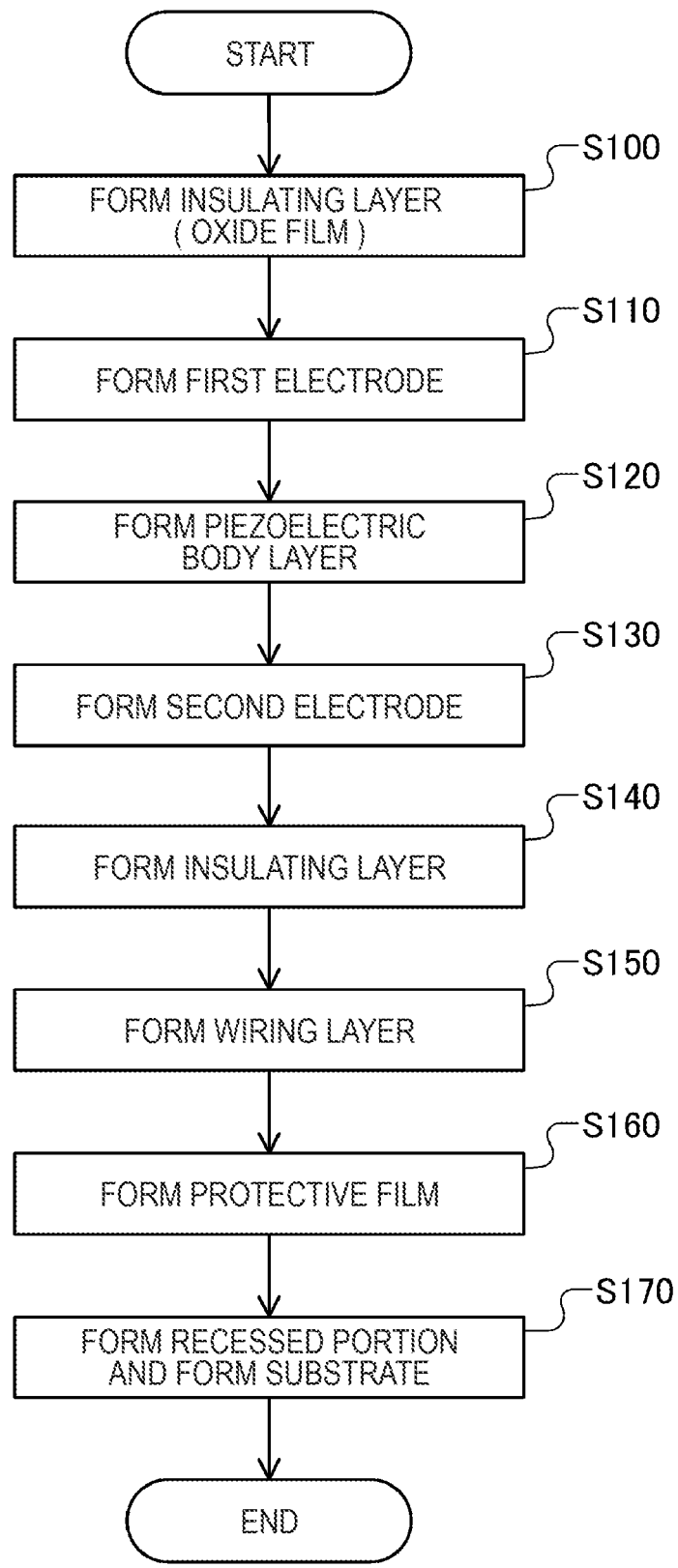
FIG. 7 is a flowchart illustrating a film forming process performed in a manufacturing procedure of the piezoelectric vibration unit according to the present embodiment.
Figure 8:
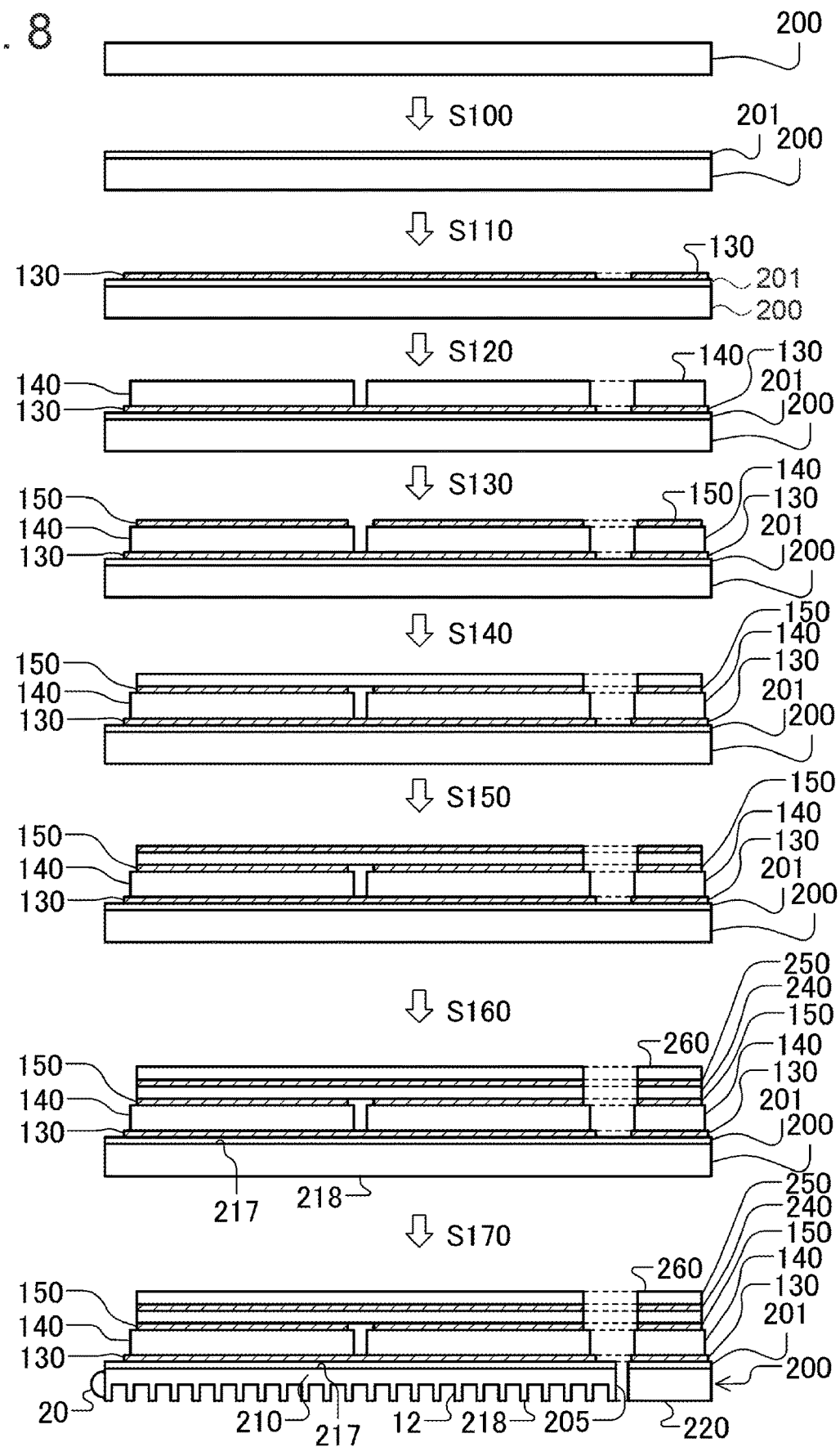
FIG. 8 is a view illustrating the manufacturing procedure of the piezoelectric vibration unit according to the present embodiment.

FIG. 7 is a flowchart illustrating a film forming process performed in a manufacturing procedure of the piezoelectric vibration unit 100 according to the present embodiment. FIG. 8 is a view illustrating the manufacturing procedure of the piezoelectric vibration unit 100 according to the present embodiment. In Step S100, an insulating film 201 is formed on the substrate 200. For example, it is possible to use a Si wafer as the substrate 200. It is possible to form a plurality of piezoelectric vibration units 100 on one Si wafer. For example, it is possible to use, as the insulating film 201, a SiO$_2$ film that is formed by performing thermal oxidation on a surface of the substrate 200. The insulating film 201 is omitted in FIG. 1. Alternatively, it is possible to use organic materials such as alumina (Al$_2$O$_3$), acryl, or polyimide, as the insulating film 201. In a case where the substrate 200 is the insulating body, it is possible to omit a procedure of forming the insulating film 201.

In Step S110, the first electrode 130 is formed, and patterning is performed. For example, it is possible to form the first electrode 130 through sputtering, and it is possible to perform the patterning through etching.

In Step S120, the piezoelectric body 140 is formed on the first electrode 130, and patterning is performed. For example, the shape of the piezoelectric body 140 can be formed through a sol-gel method. In other words, a sol-gel solution of the piezoelectric body material falls in droplets on the substrate 200 (the first electrode 130) and the substrate 200 is rotated in a high speed. In this manner, a thin film of the sol-gel solution is formed on the first electrode 130. Then, baking is temporarily performed at a temperature of 200 to 300° C., and a first layer of the piezoelectric body material is formed on the first electrode 130. Then, a plurality of cycles of the droplet falling, the high-speed rotation, and the temporary baking of the sol-gel solution are repeated, and thereby a piezoelectric body film is formed to a desired thickness on the first electrode 130. One layer of the piezoelectric body formed in one cycle has a thickness also depending on viscosity of the sol-gel solution or the rotation speed of the substrate 200; however, the layer is about 50 nm to 150 nm in thickness. After the piezoelectric body film is formed to the desired thickness, sintering is performed at a temperature of 600° C. to 1,000° C., and thereby the piezoelectric body 140 is formed. When the thickness of the piezoelectric body 140 after the sintering is 50 nm (0.05 μm) to 20 μm, it is possible to realize a small piezoelectric drive device 10. When the thickness of the piezoelectric body 140 is 0.05 μm or larger, it is possible to generate a sufficiently large force depending on the expansion/contraction of the piezoelectric body 140. In addition, when the thickness of the piezoelectric body 140 is 20 μm or smaller, it is possible to generate a sufficiently large force even in a case where the voltage applied to the piezoelectric body 140 is 600 V or smaller. As a result, the drive circuit 300 for driving the piezoelectric drive device 10 can be configured of an inexpensive element. The thickness of the piezoelectric body may be 400 nm or larger. In this case, it is possible to increase the force that is generated by the piezoelectric element. The temperature or the time of the temporary baking or the sintering is an example and is appropriately selected depending on the piezoelectric body material.

In a case where the sintering is performed after the thin film of the piezoelectric body material is formed through the sol-gel method, merits are as follows. (a) The thin film is more easily formed, (b) lattice directions are set to be coincident with each other such that it is easy to perform crystallization, and (c) it is possible to improve the voltage resistance of the piezoelectric body, compared to a sintering method in the related art in which the sintering is performed by mixing a raw material powder.

In the present embodiment, in Step S120, the patterning of the piezoelectric body 140 is performed through ion milling with an argon ion beam. Instead of the patterning using the ion milling, the patterning may be performed through another arbitrary patterning method (for example, dry etching using chlorine-based gas).

In Step S130, the second electrode 150 is formed on the piezoelectric body 140, and the patterning is performed. Similar to the first electrode 130, it is possible to perform the forming and patterning of the second electrode 150 through the sputtering and etching.

In Step S140, the insulating film 240 is formed on the second electrode 150. In Step S150, the wiring electrode 250 is formed on the insulating film 240.

Figure 9:
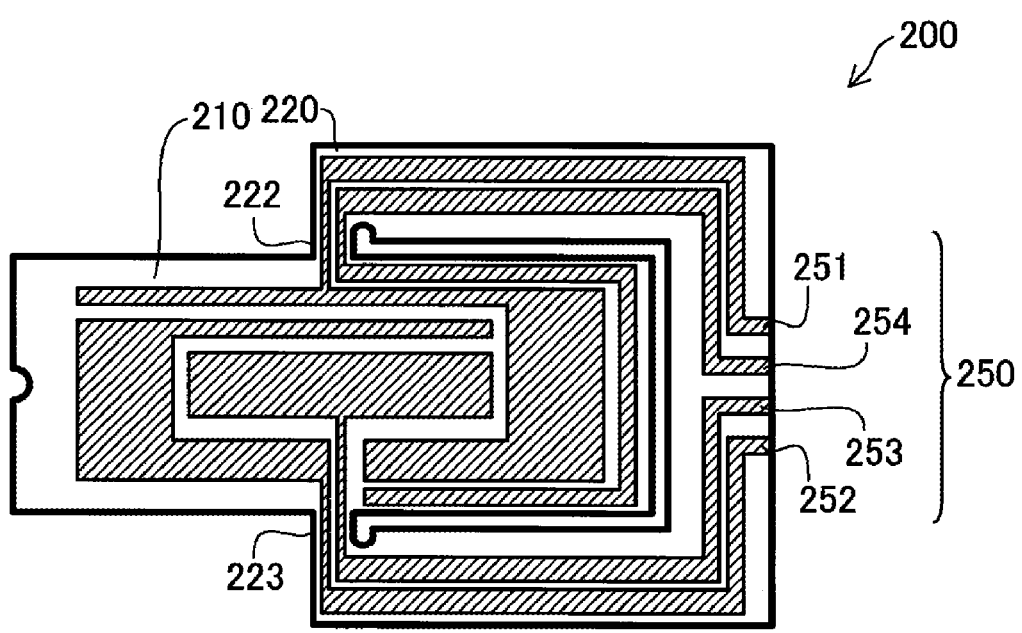
FIG. 9 is a view illustrating a pattern of a wiring electrode.

FIG. 9 is a view illustrating a pattern of the wiring electrode 250. The wiring electrode 250 has four wiring patterns 251, 252, 253, and 254. The wiring patterns 251 to 254 are formed to reach the vibrating body 210 through the connecting portions 222 and 223 on an upper side from the fixed portion 221. The first wiring pattern 251 is connected to the second electrode 150 of the piezoelectric elements 110a and 110d (FIG. 1) on the vibrating body 210. Similarly, a second wiring pattern 252 is connected to the second electrode 150 of the piezoelectric elements 110b and 110c on the vibrating body 210, a third wiring pattern 253 is connected to the second electrode 150 of the piezoelectric element 110e on the vibrating body 210, and the fourth wiring pattern 254 is connected to the first electrode 130 of the piezoelectric elements 110a, 110b, 110c, 110d, and 110e on the vibrating body 210. In addition, the wiring patterns 251 to 254 are connected to the wiring from the drive circuit 300 on the support 220 (except for the connecting portions 222 and 223). The wiring patterns 251 to 254 are not connected to the first electrode 130 and the second electrode 150 on the fixed portion 221.

In Step S160, the protective film 260 is formed. In Step S170, the shape of each substrate 200 is formed through the etching, and at the same time the gap 205 is formed between the vibrating body 210 and the support 220, and the recessed portion 216 is formed in the first side 211. The contact 20 adheres to the recessed portion 216 with adhesive. In addition, the recessed portions 12 are formed in the second surface 218 of the vibrating body 210.

As described above, according to the present embodiment, the vibrating body 210 and the support 220 (the fixed portion 221 and the connecting portions 222 and 223) are integrally formed, and the piezoelectric element 110 in which the first electrode 130, the piezoelectric body 140, and the second electrode 150 are integrally formed on at least one surface of the vibrating body 210 is provided. Hence, an adhesive film is not provided between the vibrating body 210 and the piezoelectric element 110, and a transmission loss of the drive power is unlikely to occur.

Figure 10A:
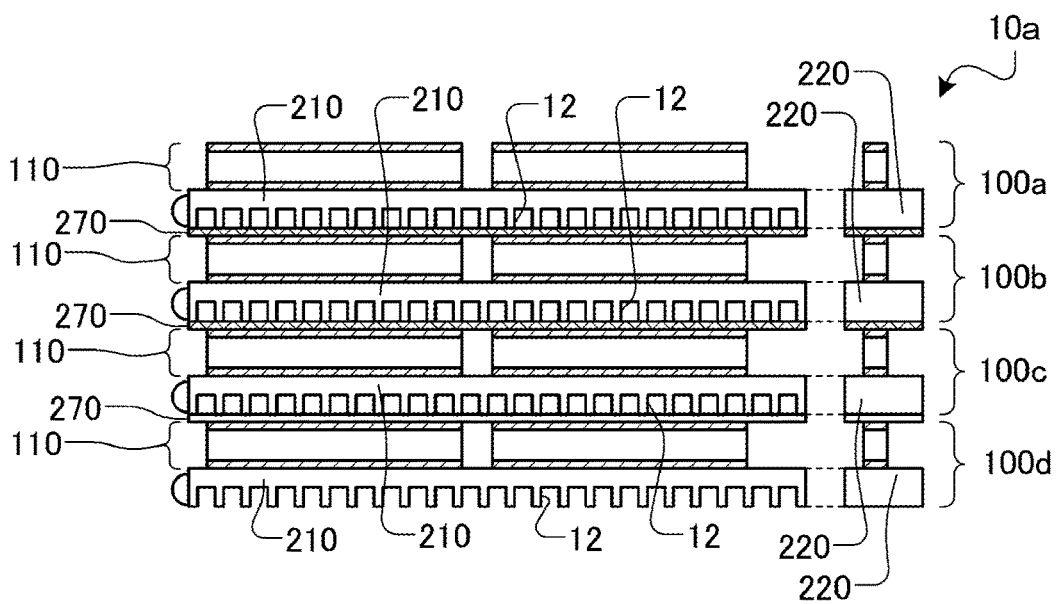
FIGS. 10A-10C illustrate views of configurational examples of the piezoelectric drive device.
Figure 10B:
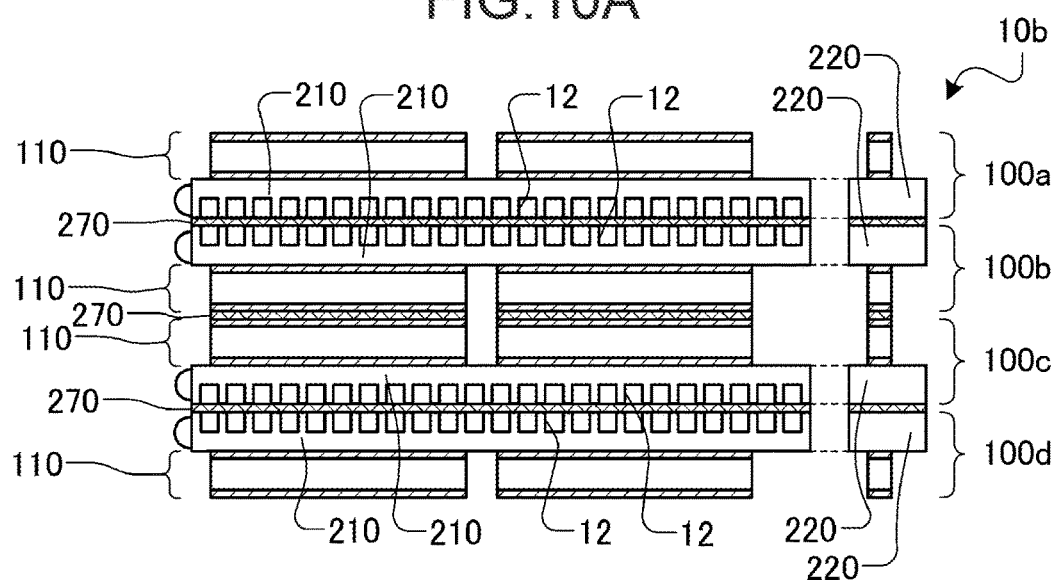
Figure 10C:
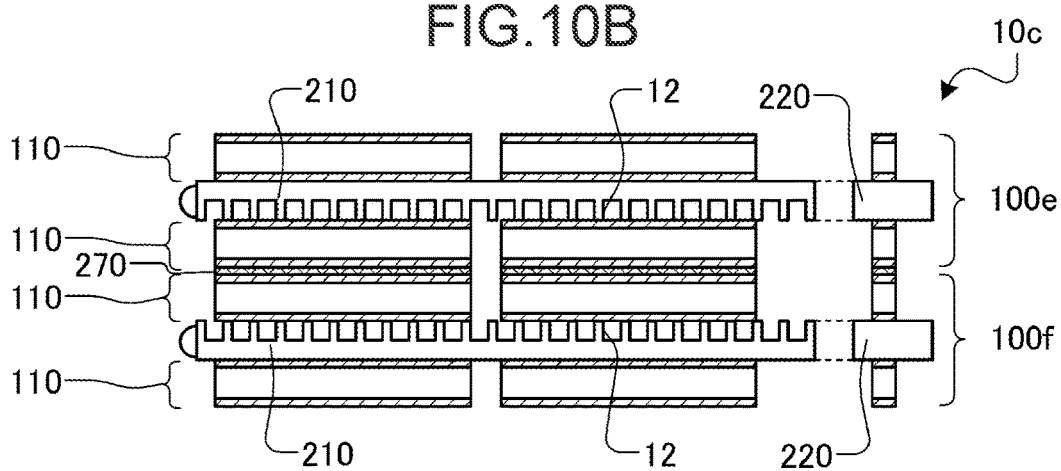

FIG. 10 is a diagram illustrating configurational examples of the piezoelectric drive device. FIGS. 10(A) and 10(B) are views in which four piezoelectric vibration units 100a, 100b, 100c, and 100d are provided, and FIG. 10(C) is a view in which two piezoelectric vibration units 100e and 100f are provided.

A piezoelectric drive device 10a illustrated in FIG. 10(A) includes the four piezoelectric vibration units 100a, 100b, 100c, and 100d. The piezoelectric vibration units 100a to 100d include the vibrating body 210 and the support 220, similar to the piezoelectric vibration unit 100 described above. A support and a fixed portion of a second piezoelectric vibration unit 100b are referred to as a "second support" and a "second fixed portion". Hereinafter, the same is true of a third piezoelectric vibration unit 100c and a fourth piezoelectric vibration unit 100d. In this example, in the second piezoelectric vibration unit 100b, the vibrating body 210 of a first piezoelectric vibration unit 100a and the piezoelectric element 110 (a second piezoelectric element) of the second piezoelectric vibration unit 100b adjacent to the first piezoelectric vibration unit 100a adhere to each other with an adhesive film 270. According to this, the shape of the recessed portions 12 of the surface of the vibrating body 210 play a role of a shelter of the adhesive film 270, and thus it is possible to prevent the adhesive film 270 from oozing out.

A piezoelectric drive device 10b illustrated in FIG. 10(B) includes the four piezoelectric vibration units 100a, 100b, 100c, and 100d. Here, in FIG. 10(B), the vibrating body 210 of the first piezoelectric vibration unit 100a and the vibrating body 210 (also referred to as a "second vibrating body 210") of the second piezoelectric vibration unit 100b adjacent to the first piezoelectric vibration unit 100a adhere to each other with the adhesive film 270. The piezoelectric element 110 of the second piezoelectric vibration unit 100b and the piezoelectric element 110 of the third piezoelectric vibration unit 100c adjacent to the second piezoelectric vibration unit 100b adhere to each other with the adhesive film 270. According to this, the shape of the recessed portions 12 of the surface of the vibrating body 210 play a role of a shelter of the adhesive film 270, and thus it is possible to prevent the adhesive film 270 from oozing out.

The vibrating body 210 of the first piezoelectric vibration unit 100a and the vibrating body 210 (also referred to as the "second vibrating body 210") of the second piezoelectric vibration unit 100b adjacent to the first piezoelectric vibration unit 100a may be shifted through the recessed portions 12 and fitted (right and left in the figure) to each other regardless of presence or absence of the adhesive film 270.

A piezoelectric drive device 10c illustrated in FIG. 10(C) includes the two piezoelectric vibration units 100e and 100f, and the two piezoelectric vibration units 100e and 100f are configured to have the piezoelectric elements 110 on both surfaces of the vibrating body 210. The piezoelectric element 110 of the first piezoelectric vibration unit 100e and the piezoelectric element 110 of the second piezoelectric vibration unit 100f adjacent to the first piezoelectric vibration unit 100e adhere to each other with the adhesive film 270.

In this manner, the piezoelectric drive device 10 may include a configuration in which two or more piezoelectric vibration units 100 are stacked in a normal direction of the vibrating body 210. In this manner, it is possible to increase the drive power. In the present embodiment, the piezoelectric drive device 10 has a configuration in which two or more piezoelectric vibration units 100 are stacked in the normal direction of the vibrating body 210; however, the two or more piezoelectric vibration units 100 may be disposed along the plane of the vibrating body 210. According to this, it is possible to perform a thinning process of the piezoelectric drive device 10, compared to a configuration in which the two piezoelectric vibration units 100 are stacked in the normal direction of the vibrating body 210.

Figure 11A:
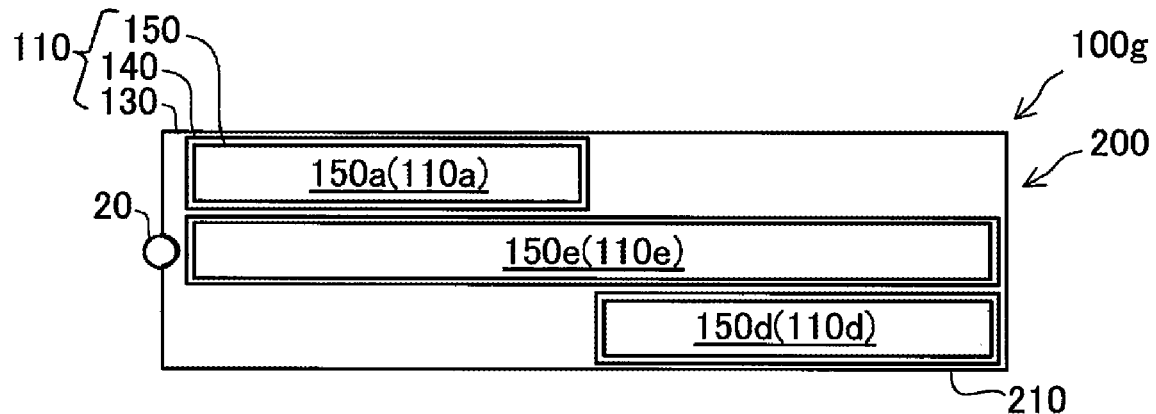
FIGS. 11A-11C illustrate plan views of a piezoelectric vibration unit as another embodiment.
Figure 11B:
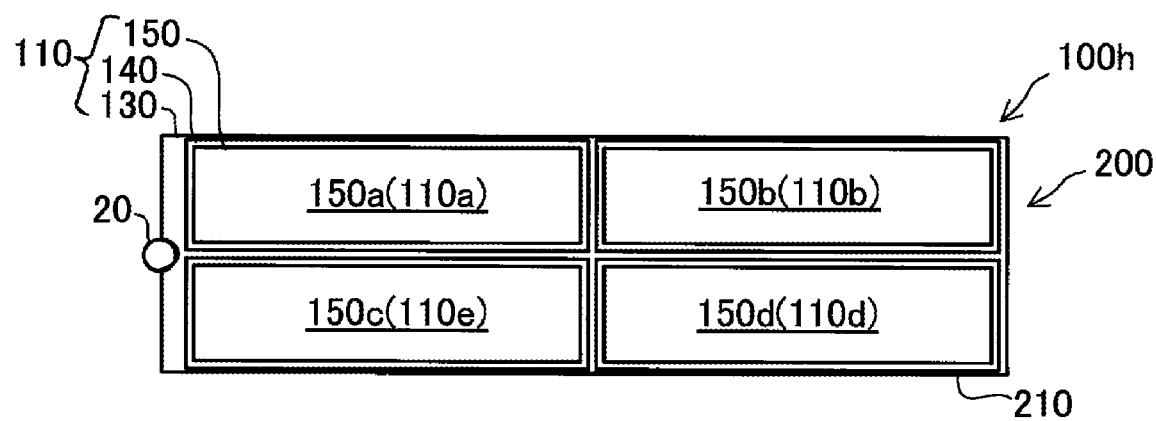
Figure 11C:
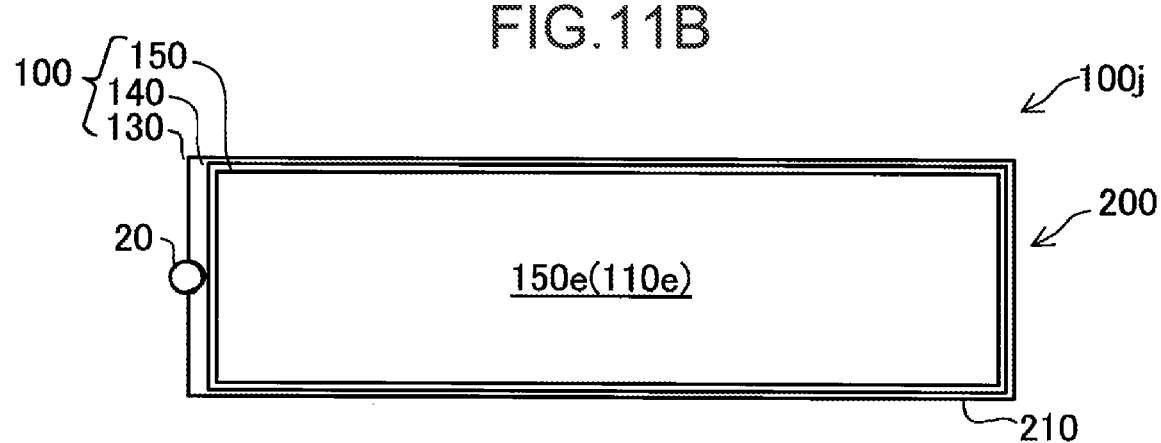

FIG. 11 illustrates plan views of a piezoelectric vibration unit as another embodiment and is a view corresponding to FIG. 1(A) in the first embodiment. FIG. 11(A) is a view in which three piezoelectric elements 110a, 110e, and 110d are formed, FIG. 11(B) is a view in which four piezoelectric elements 110a, 110b, 110c, 110d are formed, and FIG. 11(C) is a view in which one second electrode 150e is formed. In FIGS. 11(A), 11(B), and 11(C), for the convenience of illustration, only the vibrating body 210 is illustrated and the support 220 or the connecting portions 222 and 223 are omitted. In the piezoelectric vibration unit 100g in FIG. 11(A), a pair of the piezoelectric element 110b and 110c are omitted. The piezoelectric vibration unit 100g can also rotate the rotor 50 in the one direction z as illustrated in FIG. 6. Since the same voltage is applied to three piezoelectric elements 110a, 110e, and 110d in FIG. 11(A), the second electrodes (150a, 150e, and 150d) of the three piezoelectric elements 110a, 110e, and 110d may be formed as one continuous electrode film.

FIG. 11(B) is a plan view of a piezoelectric vibration unit 100h as still another embodiment of the present invention. In the piezoelectric vibration unit 100h, the central piezoelectric element 110e in FIG. 1(A) is omitted, and the other four piezoelectric elements 110a, 110b, 110c, and 110d are formed to have an area larger than that in FIG. 1(A). The piezoelectric vibration unit 100c can achieve substantially the same effect as that in the first embodiment.

FIG. 11(C) is a plan view of a piezoelectric vibration unit 100j as still another embodiment of the present invention. In the piezoelectric vibration unit 100j, the four second electrode 150a, 150b, 150c, and 150d in FIG. 1(A) are omitted, and one second electrode 150e is formed to have a large area. The piezoelectric vibration unit 100d expands or contracts in only the longitudinal direction, and it is possible to apply a large force to the drive target body (not illustrated in the figure) from the contact 20.

As can be understood from FIGS. 1, 11(A), 11(B), and 11(C), it is possible to provide at least one electrode film as the second electrode 150 of the piezoelectric vibration unit 100. However, as in the embodiment illustrated in FIGS. 1, 11(A), and 11(B), it is preferable that the piezoelectric elements 110 (second electrodes 150) are provided at opposing corner positions of the vibrating body 210 having the rectangular shape, in that it is possible to deform the vibrating body 210 into the meandering shape that bends in the plane thereof.

Figure 12:
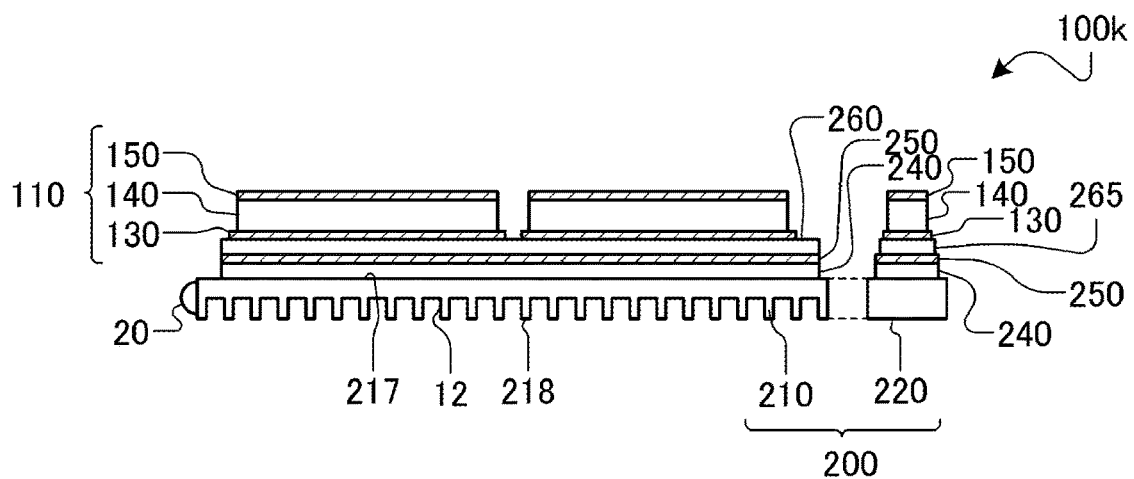
FIG. 12 is a view illustrating another configuration of the piezoelectric vibration unit.

FIG. 12 is a view illustrating another configuration of the piezoelectric vibration unit 100. A piezoelectric vibration unit 100k is different in the following points, compared to the piezoelectric vibration unit 100 illustrated in FIG. 1. In the piezoelectric vibration unit 100 illustrated in FIG. 1, the piezoelectric element 110 is formed on the substrate 200, and the insulating film 240, the wiring electrode 250, and the protective film 260 are formed thereon. In the piezoelectric vibration unit 100k illustrated in FIG. 12, the insulating film 240, the wiring electrode 250, and an insulating film 265 are formed on the substrate 200, and the piezoelectric element 110 is disposed on the insulating film 265. In other words, the wiring electrode 250 may be formed to be closer to the side of the substrate 200 than to the piezoelectric body 140. Such a configuration may be good. In this case of the configuration, the piezoelectric body 140 is not provided in a lower layer of the wiring electrode 250, and no influence of the thickness of the piezoelectric body 140 is applied. Therefore, an effect in which the wiring electrode 250 is unlikely to be disconnected is achieved.

(Embodiment of Device Using Piezoelectric Drive Device)

The piezoelectric drive device 10 described above can apply large forces to the driven member by using resonance, and thus it is possible to apply a large force to various types of device. For example, the piezoelectric drive device 10 can be used as the drive device in various types of devices such as a robot (including an electronic component conveying device (IC handler)), a medicine injecting pump, a calendar feeder of a timepiece, or a printing device (for example, a paper feeding mechanism, here, the vibrating plate is not resonant in the piezoelectric drive device used in a head, and therefore it is not possible to apply to the head). Hereinafter, representative embodiments will be described.

Figure 13:
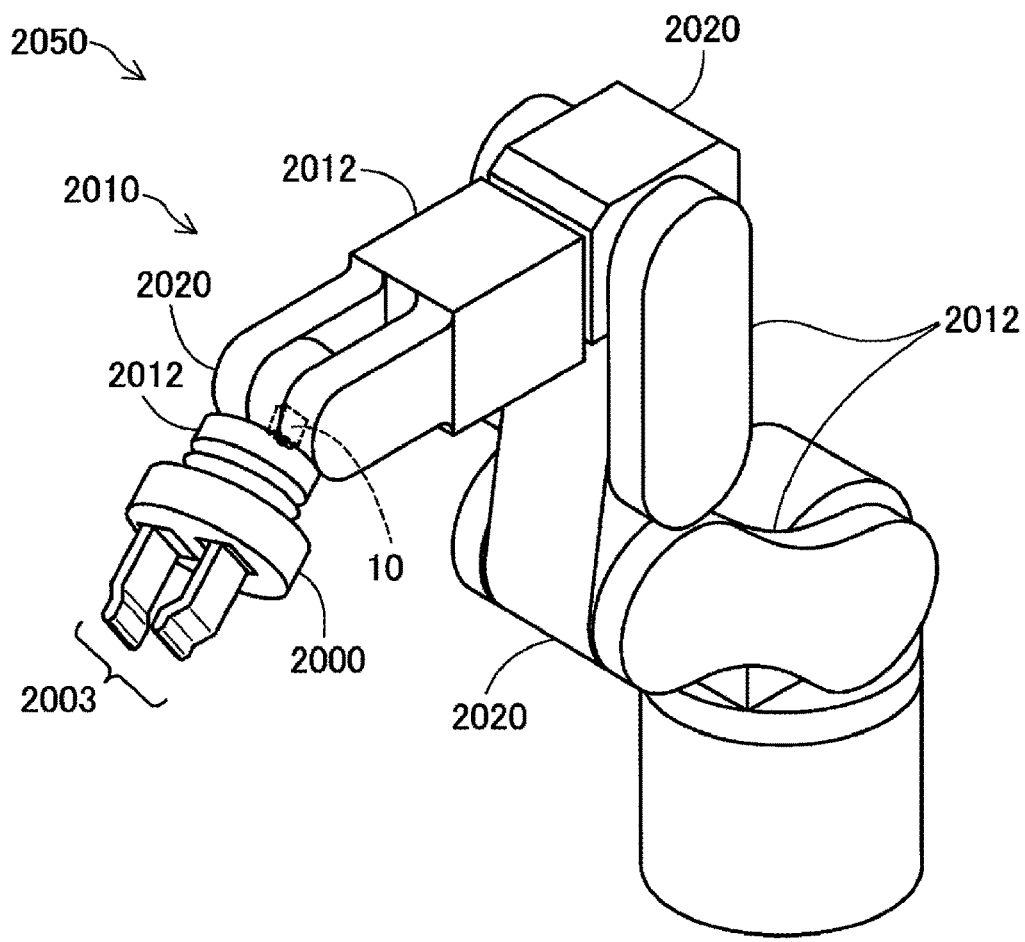
FIG. 13 is a view illustrating an example of a robot using the piezoelectric drive device.

FIG. 13 is a view illustrating an example of a robot 2050 using the piezoelectric drive device 10 described above. The robot 2050 includes a plurality of link units 2012 (also referred to as a "link member") and an arm 2010 (also referred to as an arm portion) including a plurality of joint portions 2020 which are connected to each other in a state in which the joint portion rotates or bendable between the link units 2012. The piezoelectric drive device 10 described above is installed in the joint portion 2020, and it is possible to rotate or bend the joint portion 2020 by an arbitrary angle by using the piezoelectric drive device 10. A robot hand 2000 is connected to the distal end of the arm 2010. The robot hand 2000 includes a pair of grip portion 2003. The piezoelectric drive device 10 is also installed in the robot hand 2000, and it is possible to perform gripping by opening or closing the grip portion 2003 by using the piezoelectric drive device 10. In addition, the piezoelectric drive device 10 is provided between the robot hand 2000 and the arm 2010, and it is possible to rotate the robot hand 2000 with respect to the arm 2010 by using the piezoelectric drive device 10.

Figure 14:
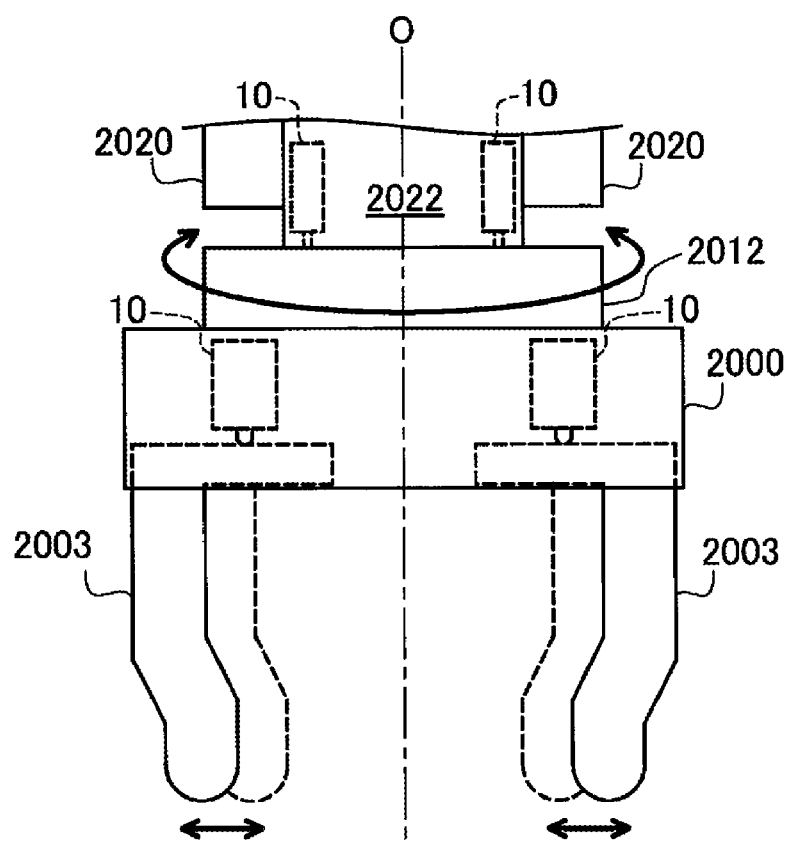
FIG. 14 is a view illustrating a wrist region of the robot.

FIG. 14 is a view illustrating a wrist region of the robot 2050 illustrated in FIG. 13. A wrist rotating portion 2022 is interposed between the wrist joint portions 2020, and a wrist link unit 2012 is attached to the wrist rotating portion 2022 so as to be rotatable around the central axis O of the wrist rotating portion 2022. The wrist rotating portion 2022 includes the piezoelectric drive device 10, and the piezoelectric drive device 10 rotates the wrist link unit 2012 and the robot hand 2000 around the central axis O. A plurality of grip portions 2003 are provided to be upright in the robot hand 2000. A base portion of the grip portion 2003 is movable in the robot hand 2000, and the piezoelectric drive device 10 is mounted in a region of the root of the grip portion 2003. Therefore, the piezoelectric drive device 10 is operated, and thereby it is possible to move the grip portion 2003 and to grip a target object.

The robot is not limited to a single-arm robot, and it is possible to apply the piezoelectric drive device 10 to a multi-arm robot having two or more arms. Inside the wrist joint portion 2020 or the robot hand 2000, an electric power line, through which electric power is supplied to various devices such as an inner force sensor or a gyro sensor, or a signal line or the like, through which a signal is transmitted, and very much wiring, as well as the piezoelectric drive device 10, are needed. Hence, it is very difficult to dispose the wiring inside the joint portion 2020 or the robot hand 2000. Hence, the piezoelectric drive device 10 of the embodiment described above can more reduce driving current than the normal motor or a piezoelectric drive device in the related art. Therefore, it is possible to dispose the wiring even in a small space such as in the joint portion 2020 (particularly, the joint portion of the distal end of the arm 2010) or the robot hand 2000.

Figure 15:
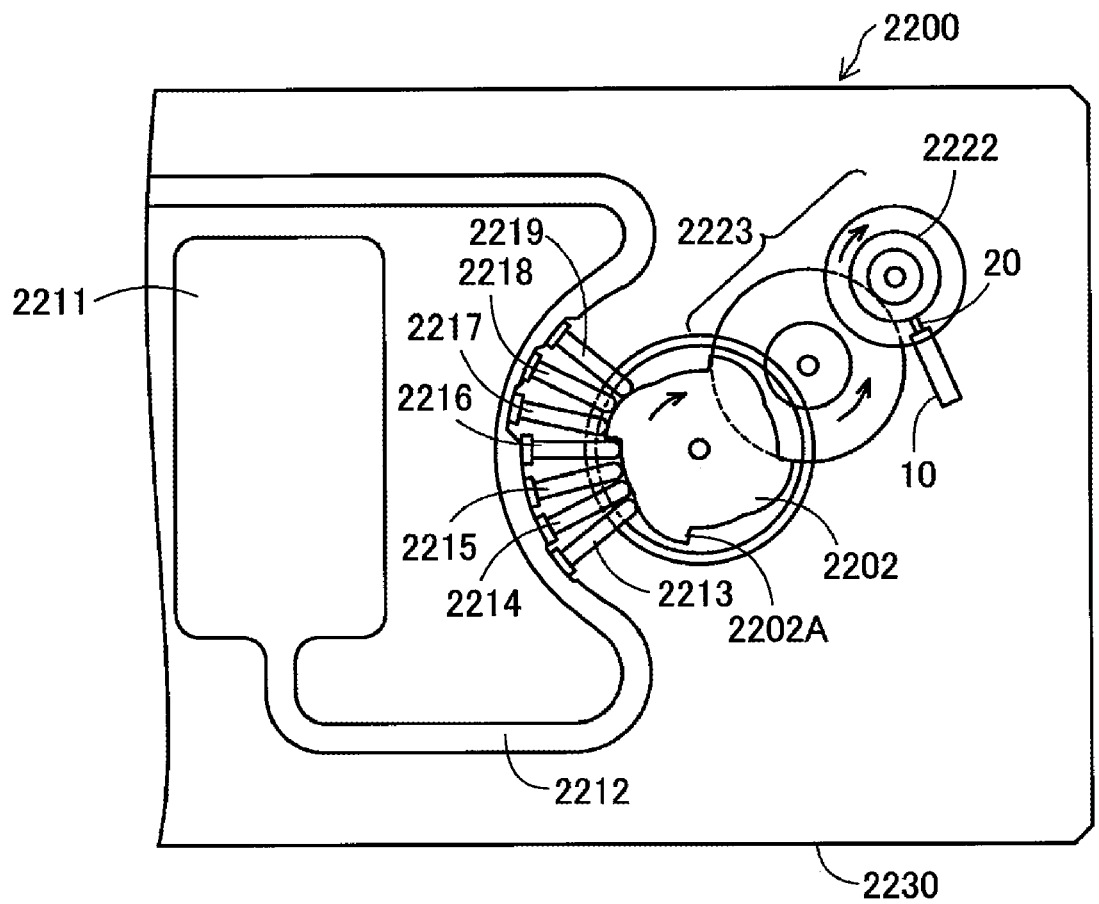
FIG. 15 is a view illustrating an example of a liquid feeding pump using the piezoelectric drive device.

FIG. 15 is a view illustrating an example of a liquid feeding pump 2200 using the piezoelectric drive device 10 described above. The liquid feeding pump 2200 includes a reservoir 2211, a tube 2212, the piezoelectric drive device 10, a rotor 2222, a deceleration transmitting mechanism 2223, a cam 2202, a plurality of fingers 2213, 2214, 2215, 2216, 2217, 2218, and 2219 in a case 2230. The reservoir 2211 is an accommodating portion for accommodating a liquid which is a transport target. The tube 2212 is a pipe for transporting the liquid delivered from the reservoir 2211. The contact 20 of the piezoelectric drive device 10 is provided in a state of being pressed against a side surface of the rotor 2222, and the piezoelectric drive device 10 rotatably drives the rotor 2222. A rotating force of the rotor 2222 is transmitted to the cam 2202 via the deceleration transmitting mechanism 2223. The fingers 2213 to 2219 are members for blocking the tube 2212. When the cam 2202 rotates, the fingers 2213 to 2219 are pushed to the outside in a radial direction in order by a protrusion 2202A of the cam 2202. The fingers 2213 to 2219 block the tube 2212 in order from the upstream side in the transport direction (side of the reservoir 2211). In this manner, a fluid in the tube 2212 is transported to the downstream side in order. In this manner, it is possible to send a very small amount of liquid with high accuracy. Moreover, it is possible to realize a small liquid feeding pump 2200. The disposition of the members is not limited to the figures. In addition, a member such as a finger is not provided, and a configuration in which a ball or the like provided in the rotor 2222 blocks the tube 2212 may be employed. The liquid feeding pump 2200 described above can be used as a medicine injecting device that injects medicine such as insulin into a human body. Here, the piezoelectric drive device 10 of the embodiment described above is used, and thereby the driving current decreases more than the piezoelectric drive device in the related art. Therefore, it is possible to reduce power consumption of the medicine injecting device. Hence, in a case where the medicine injecting device is driven by a battery, the use of the piezoelectric drive device is particularly effective.

As described above, the embodiments of the present invention are described based on some examples; however, the embodiments of the invention described above are provided to achieve easy understanding of the present invention, and the present invention is not limited thereto. The present invention can be modified and improved without departing from a range of gist and claims thereof, and it is needless to say that an equivalent object is added to the present invention.

The entire disclosure of Japanese Patent Application No. 2015-150424, filed Jul. 30, 2015 is expressly incorporated by reference herein.

The invention claimed is:

1. A piezoelectric drive device comprising:
a vibrating monolithic plate having a first surface and a second surface opposite to each other;
a plurality of recesses disposed in the second surface;
a piezoelectric element provided on the first surface, the piezoelectric element being configured with a first electrode, a second electrode, and a piezoelectric body that is positioned between the first electrode and the second electrode; and
a contact member disposed at a side surface of the vibrating monolithic plate, the contact member contacting a driven member to move the driven member,
wherein the plurality of recesses overlap the piezoelectric element when viewed in a normal direction of the second surface,
a thickness of the vibrating monolithic plate is a predetermined thickness T or smaller, and
when the thickness of the vibrating monolithic plate is the predetermined thickness T, a thickness of the piezoelectric body is $1/5$ of T or smaller.

2. The piezoelectric drive device according to claim 1,
wherein the vibrating monolithic plate has a symmetrical shape to a first line, and
wherein the plurality of recesses are arranged to be symmetric to the first line.

3. The piezoelectric drive device according to claim 1,
wherein the vibrating monolithic plate has a symmetrical shape to a first line, and
wherein the plurality of recesses are arranged to be nonsymmetric to the first line.

4. The piezoelectric drive device according to claim 1, wherein the first surface is flat.

5. The piezoelectric drive device according to claim 1, wherein a thickness of the piezoelectric body is within a range of 50 nm to 20 µm.

6. The piezoelectric drive device according to claim 1, wherein the vibrating monolithic plate contains silicon.

7. The piezoelectric drive device according to claim 1, wherein each of the plurality of recesses is in either a groove shape or a hole shape.

8. The piezoelectric drive device according to claim 7,
wherein the vibrating monolithic plate has a symmetrical shape to a first line, and
wherein the plurality of recesses are arranged to be symmetric to the first line.

9. The piezoelectric drive device according to claim 1, further comprising:
a first piezoelectric vibration unit and a second piezoelectric vibration unit, each of the first piezoelectric vibration unit and the second piezoelectric vibration unit having the vibrating monolithic body and the piezoelectric element.

10. The piezoelectric drive device according to claim 9, wherein the second piezoelectric vibration unit is stacked on the first piezoelectric vibration unit.

11. A robot comprising:
a plurality of links;
joints that connect the plurality of links; and
a piezoelectric drive device configured to rotate the plurality of links with respect to the joints, the piezoelectric drive device including:
a vibrating monolithic plate having a first surface and a second surface opposite to each other;
a plurality of recesses disposed in the second surface;
a piezoelectric element provided on the first surface, the piezoelectric element being configured with a first electrode, a second electrode, and a piezoelectric body that is positioned between the first electrode and the second electrode; and
a contact member disposed at a side surface of the vibrating monolithic plate, the contact member contacting one of the plurality of links to rotate the one of the plurality of links,
wherein the plurality of recesses overlap the piezoelectric element when viewed in a normal direction of the second surface,
a thickness of the vibrating monolithic plate is a predetermined thickness T or smaller, and
when the thickness of the vibrating monolithic plate is the predetermined thickness T, a thickness of the piezoelectric body is $1/5$ of T or smaller.

12. A method for driving a piezoelectric drive device, the piezoelectric drive device including:
a vibrating monolithic plate having a first surface and a second surface opposite to each other;
a plurality of recesses disposed in the second surface;
a piezoelectric element provided on the first surface, the piezoelectric element including a first electrode, a second electrode, and a piezoelectric body that is positioned between the first electrode and the second electrode; and
a contact member disposed at a side surface of the vibrating monolithic plate, the contact member contacting a driven member to move the driven member,
the method comprising:
applying a voltage, which is periodically changed, between the first electrode and the second electrode so as to vibrate the vibrating monolithic plate and move the driven member by the contact member,
wherein a thickness of the vibrating monolithic plate is a predetermined thickness T or smaller, and
when the thickness of the vibrating monolithic plate is the predetermined thickness T, a thickness of the piezoelectric body is $1/5$ of T or smaller.

* * * * *